United States Patent [19]

Tsutsumi et al.

[11] Patent Number: 5,303,268
[45] Date of Patent: Apr. 12, 1994

[54] AUTOMATIC POWER CONTROL APPARATUS

[75] Inventors: Shyuitsu Tsutsumi; Tatsuya Yamada, both of Tokyo, Japan

[73] Assignee: Kabushiki Kaisha Toshiba, Kawasaki, Japan

[21] Appl. No.: 735,898

[22] Filed: Jul. 25, 1991

[30] Foreign Application Priority Data

Jul. 27, 1990 [JP] Japan .................................. 2-197866

[51] Int. Cl.⁵ ............................................ H04B 7/005
[52] U.S. Cl. ...................................... 375/60; 455/116
[58] Field of Search ............... 455/69, 72, 116, 126; 332/155, 157; 330/129, 130, 138, 140, 278, 279; 375/59, 60, 68, 70, 73; 370/95.3, 79

[56] References Cited

U.S. PATENT DOCUMENTS

| | | | |
|---|---|---|---|
| 4,412,337 | 10/1983 | Bickley et al. | 455/126 |
| 4,592,073 | 5/1986 | Watanabe | 375/60 |
| 4,706,262 | 10/1987 | Ohta | 455/116 |
| 4,777,653 | 10/1988 | Bonnerot et al. | 455/69 |
| 4,905,235 | 2/1990 | Saburi | 370/95.3 |
| 4,992,753 | 2/1991 | Jensen | 455/116 |
| 4,992,753 | 2/1991 | Jensen | 455/116 |
| 5,101,176 | 3/1992 | Norimatsu | 455/126 |
| 5,121,081 | 6/1992 | Hori | 455/126 |
| 5,144,258 | 9/1992 | Nakanishi et al. | 330/129 |

FOREIGN PATENT DOCUMENTS

| | | |
|---|---|---|
| 0184383A2 | 6/1986 | European Pat. Off. . |
| 0314962A2 | 5/1989 | European Pat. Off. . |
| 2146191A | 4/1985 | United Kingdom . |

*Primary Examiner*—Benedict V. Safourek
*Attorney, Agent, or Firm*—Banner, Birch, McKie & Beckett

[57] ABSTRACT

An automatic power control apparatus for use in a radio communication system employing a Time Division Multiplexing Access (TDMA) system according to the present invention has a level varying unit for amplifying a modulated wave that is output from a transmitter at an amplification factor specified by an external device, a level detecting unit for detecting a power level of a modulated wave, a computing unit for computing a power level of a non-modulated wave which is varied by a modulated wave obtained by linearly modulating a carrier wave in response to a modulation signal generated based on digital data, and a comparing unit that is used for comparing power levels. In the automatic power control apparatus, and amplification factor of the level varying unit is adjusted so that the power levels compared by the comparing unit become equal to each other during a transmission period of the non-modulated wave. Finally, the level varying unit is then operated at the amplification factor during a transmission period of the modulated wave.

6 Claims, 9 Drawing Sheets

SYMBOL 0 1 2 3 4 5 6

AUTOMATIC POWER CONTROL APPARATUS

BACKGROUND OF THE INVENTION

1. Field of the Invention

The present invention relates to an automatic power control apparatus for stabilizing a level of output power in a radio communication system such as a cellular radio telephone system.

2. Description of the Related Art

In a radio communication system such as a cellular radio telephone system, generally, automatic power control (referred to as APC hereinafter) is performed to stabilize a level of output power while the system is operating.

Figure 4:
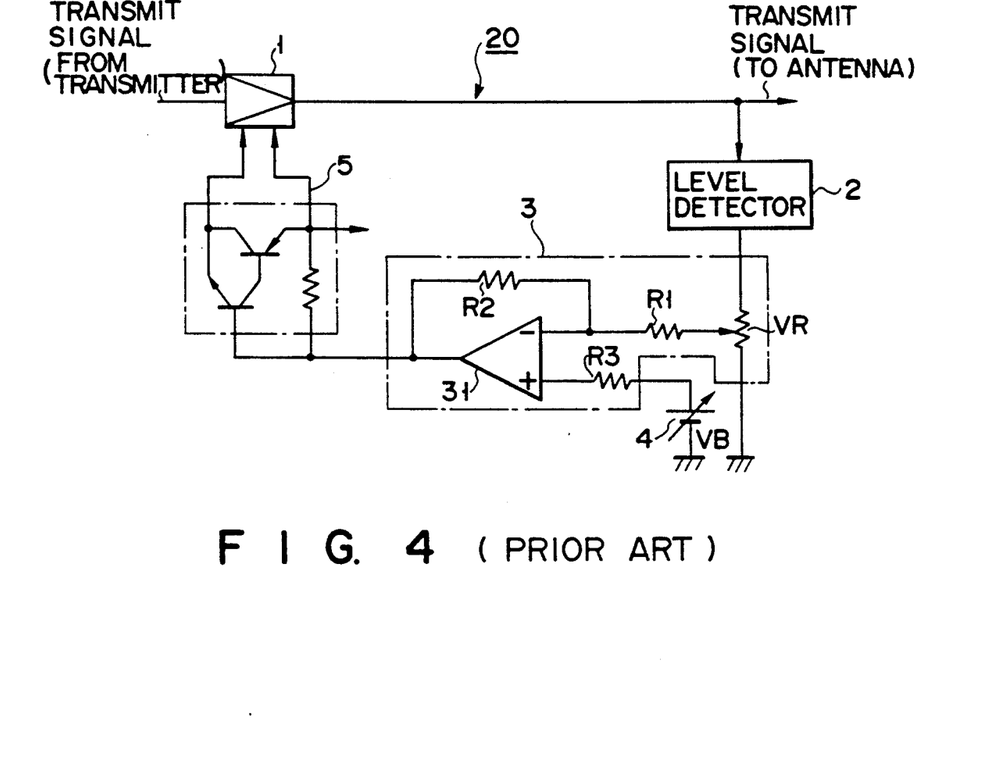
FIG. 4 is a block diagram showing a configuration of a conventional automatic control apparatus in a transmitter.

FIG. 4 is a block diagram showing the arrangement of a conventional APC apparatus. In FIG. 4, reference numeral 1 denotes a variable amplifier for amplifying a transmit signal output from a transmitter (not shown). The transmit signal is supplied to, for example, an antenna (not shown) via the variable amplifier 1. The transmit signal is also supplied from the variable amplifier 1 to a level detector 2. The level detector 2 outputs a detection signal having a voltage corresponding to a power level of the transmit signal. The detection signal is then input to a comparator circuit 3 comprising a differential amplifier 31, a variable resistor VR, and resistors R1, R2 and R3. A reference voltage VB is also applied to the comparator circuit 3 from a variable power source 4. The comparator circuit 3 compares the voltage of the detection signal output from the level detector 2 with the reference voltage VB and then supplies a difference between the voltages to a control voltage delivering circuit 5 as a comparison output voltage.

The control voltage delivering circuit 5, which is constituted of a Darlington circuit, amplifies the comparison output voltage output from the comparator circuit 3 and supplies the amplified voltage to the variable amplifier 1 as a control voltage of the amplifier 1. The variable amplifier 1 amplifies the transmit signal at a gain corresponding to the control voltage supplied from the control voltage delivering circuit 5.

Consequently, the transmit signal output from the variable amplifier 1 is always stabilized so as to have a fixed power level which depends upon the reference voltage VB preset in the variable power source 4.

Digital modulation for modulating an analog carrier by a digital signal has recently been popularized in a radio communication system. For example, quadrative amplitude modulation (referred to as QAM hereinafter) system is generally known as the digital modulation. The use of such digital modulation enables so-called time-sharing transmission. For effective use of channels, a time division multiplexing access (referred to as TDMA hereinafter) system has been adopted.

Figure 5:
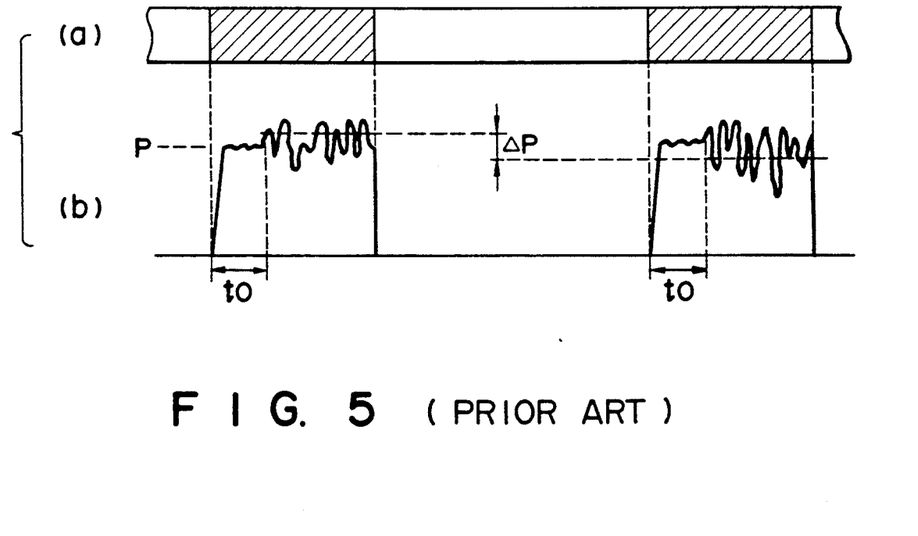
FIG. 5(a) is a view showing time slots of the conventional automatic control apparatus, in which TDMA signals are generated.
FIG. 5(b) is a view showing waveforms of transmit signals of the conventional apparatus.

A transmitter of a radio communication system to which the QAM and TDMA are applied, will be outlined. In the TDMA, the transmitter performs a transmission operation only during the time slots assigned to the transmitter itself. When the transmission operation is performed, a predetermined period t0, during which a non-modulated wave is output, is set in the initial part of each of the time slots as shown in FIG. 5(b), and the APC apparatus automatically controls power so that the non-modulated wave is adjusted to have a predetermined level P during the period t0.

In the QAM, generally, an instantaneous level of a modulated wave varies with digital data to be transmitted. More specifically, when the QAM is performed using a digital pulse, the digital pulse is caused to pass through a low-pass filter to restrict the bandwidth of the digital pulse. Since the digital pulse is expanded with respect to time by the restriction of bandwidth, the waveform of the pulse is influenced by its preceding and succeeding pulses. This means that the level of a non-modulated wave varies with a modulation signal of a modulated wave subsequent to the non-modulated wave. Since the ratio of an average level of a signal transmitted during the time slot to that of a signal transmitted during the non-modulated wave output period changes with each of the time slots, an error $\Delta P$ occurs in the average level between the time slots as shown in FIG. 5(b). FIG. 5(a) is a view showing time slots in which TDMA signals are generated, and the hatched portions in FIG. 5(a) show time slots assigned to the transmitter. FIG. 5(b) is a view showing the waveforms of transmit signals output from the variable amplifier 1.

As described above, when the conventional APC apparatus is applied to a radio communication system wherein linear modulation such as the QAM is used as a modulation system and the TDMA is used as a multiplexing access system, an error occurs in average power every time slot, and automatic power control cannot be correctly performed.

SUMMARY OF THE INVENTION

It is accordingly an object of the present invention to provide an automatic power control apparatus capable of controlling the average power levels in time slots to have the same constant value when the apparatus is applied to a radio communication system in which linear modulation such as QAM is used as a modulation system and a TDMA is used as a multiplexing access system.

An automatic power control apparatus according to the present invention comprises: a level varying unit such as a variable amplifier for amplifying a modulated wave output from a transmitter at an amplification factor specified by an external device; a level detecting unit such as a level detector circuit for detecting a power level of the modulated wave output from the level varying unit; a computing unit such as a high-speed computing unit for, during a period other than a time slot assigned to the transmitter, computing a power level of a non-modulated wave which is varied by a modulated wave obtained by linearly modulating a carrier wave in response to a modulation signal generated based on digital data to be transmitted in the next time slot; and a comparing unit such as a comparator circuit for comparing a power level, which is obtained by adding a difference between the power level computed by the computing unit and an average power level in the time slot to the average power level, with the power level detected by the level detecting unit.

In the automatic power control apparatus according to the present invention, an amplification factor of the level varying unit is adjusted so that the power levels compared by the comparing unit become equal to each other during a transmission period of the non-modulated wave, and the level varying unit is then operated at the amplification factor during a transmission period of the modulated wave.

With the above configuration, an output level of a non-modulated wave transmitted to the initial part of each time slot is computed during a period other than the time slot, that is, during a vacant time slot. A control level of the non-modulated wave is variably set on the basis of the computed output level, and the level varying unit is operated at the amplification factor set during the transmission period of the non-modulated wave. Power control is thus performed based on the average power level in each time slot. The power control is not influenced by an error in the average power level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An automatic power control (APC) apparatus according to an embodiment of the present invention, which is applied to a radio communication system wherein linear modulation such as quadrative amplitude modulation (QAM) is used as a modulation system and a time division multiplexing access system (TDMA) is used as a multiplexing access, will be described.

Figure 1:
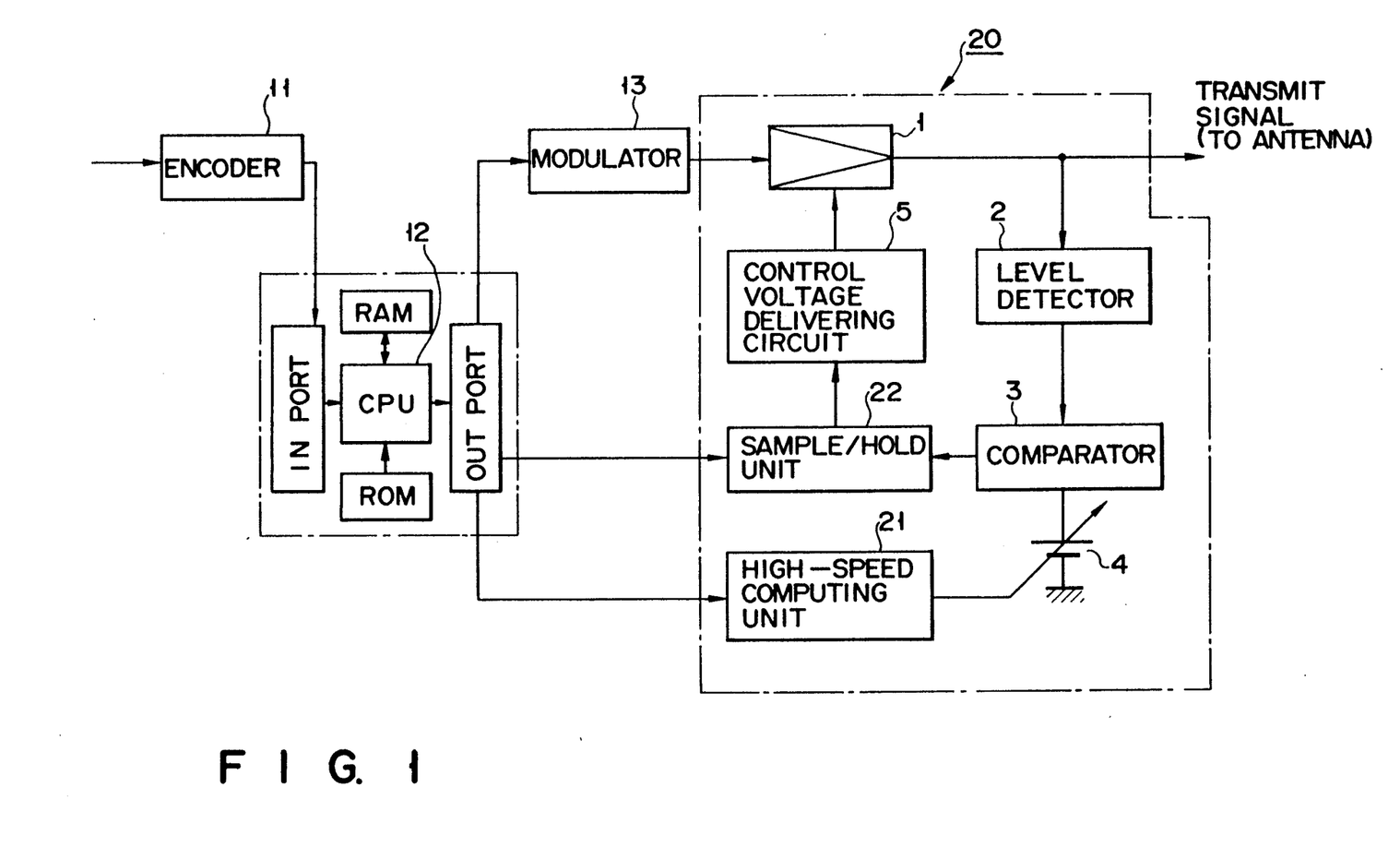
FIG. 1 is a block diagram showing a circuit arrangement of an automatic control apparatus in a transmitter, according to a first embodiment of the present invention.

FIG. 1 is a block diagram showing a circuit arrangement of the APC apparatus using in transmitter. The descriptions of the elements denoted by the same numerals as those in FIG. 4 showing a conventional APC apparatus, are omitted.

In FIG. 1, an encoder 11 digitally encodes a signal (e.g. base band signal), which is to be transmitted, into sending data. The sending data is input to a CPU 12 via an input port. The CPU 12 activates a control routine program which is constituted of a plurality of steps described later and then performs the following control in accordance with the program. The CPU 12 converts the input sending data into burst modulating data suitable for the TDMA. The burst modulating data is supplied to a modulator 13 through an output port and then undergoes quadrative amplitude modulation (QAM). The burst modulating data is finally converted into a transmit signal. The above is the arrangement of a transmitter.

In FIG. 1, reference numeral 20 indicates an APC apparatus. The APC apparatus 20 has the following function in addition to those of the conventional APC apparatus shown in FIG. 4. The burst modulating data, which is transmitted in the initial part of the next time slot, is received from the CPU 12, and a convoluting operation is performed on the basis of the burst modulating data. This operation allows a computation of the power level of a non-modulated signal transmitted in the initial part of the next time slot. The APC apparatus 20 comprises a high-speed computing unit 21 and a sample/hold unit 22, arranged between a comparator circuit 3 and control voltage delivering circuit 5, for receiving a signal indicative of the timing of a time slot from the CPU 12 and sampling an output of the comparator circuit 3 at timing corresponding to the timing of the time slot.

Figure 2:
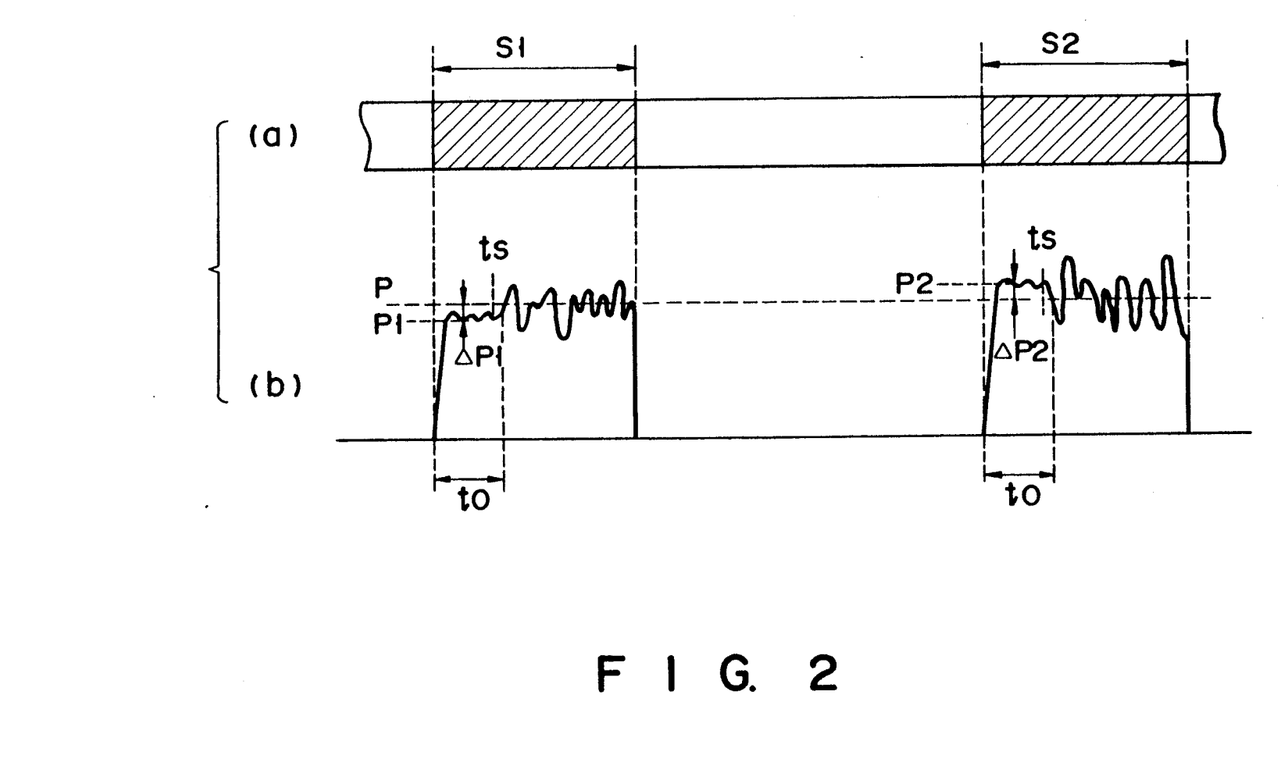
FIG. 2(a) is a view showing time slots of the automatic power control apparatus, in which TDMA signals are generated.
FIG. 2(b) is a view showing waveforms indicative of variations in transmit signals output from a variable amplifier of the apparatus shown in FIG. 1.

An operation of the APC apparatus 20 having the above configuration will be described with reference to FIGS. 2(a) and 2(b). FIG. 2(a) shows time slots in which TDMA signals of the APC apparatus are generated, and FIG. 2(b) shows waveforms representing variations in transmit signals output from the variable amplifier 1.

A transmit signal is supplied to an antenna through the encoder 11, CPU 12, modulator 13, and APC apparatus 20. The APC apparatus then performs the following APC operations.

In a vacant time slot before a time slot assigned to the sending station, the high-speed computing unit 21 receives sending data, which is to be transmitted in the next time slot, from the CPU 12. The sending data is modulated by the modulator 13 into a non-modulated wave. The unit 21 computes a power level of the non-modulated wave. The unit 21 then compares the average level of the computed power level with the level of the non-modulated wave output during the period t0 and sets a voltage corresponding to a power level obtained by adding a difference between the computed power level and the level of the non-modulated wave to a desired value, i.e., a control desired power level of the transmit signal, to the variable power source 4 as a reference voltage.

More specifically, since the level of the non-modulated wave is lower than the control desired power level P in time slot S1 in FIG. 2(a), a voltage corresponding to power P1 obtained by subtracting a difference ΔP1 between the levels from the control desired power level P is set to the variable power source 4. Since the level of the non-modulated wave is higher than the control desired power level P in time slot S2 in FIG. 2(a), a voltage corresponding to power P2 obtained by adding a difference Δ between the levels to the control desired power level P is set to the variable power source 4.

During the non-modulated wave output period T0 of the initial part of the time slot assigned to the sending station, the same APC operation as that of the conventional APC apparatus is performed by the variable amplifier 1, level detector 2, comparator circuit 3, and control voltage delivering circuit 5 on the basis of the reference voltage. Therefore, the power level of the non-modulated wave output from the variable amplifier 1 is set to P1 and P2 in the time slots S1 and S2, respectively.

At a predetermined time tS when the APC operation is sufficiently operated and the power level of the non-modulated wave is optimized, during the period T0, the sample/hold unit 22 samples an output voltage of the comparator circuit 3 and holds the output voltage during the time slot. A sampling pulse is generated in the sample/hold unit 22 in response to a signal representing the timing of the time slot supplied from the CPU 12.

As described above, after the non-modulated wave output period T0, in other words, while the modulated wave is outputting, the gain of the variable amplifier 1 is fixed to the gain controlled during the period T0, and the transmit signals whose powers P1, P2, ... are set as reference power levels are output from the variable amplifier 1.

The average power level in each of the time slots is always kept to power P (i.e. constant value), and an error in the average power level does not occur between the time slots as is apparent from FIGS. 2(a) and 2(b).

The present invention is not limited to the above embodiment. In the above embodiment, the variable amplifier is used as a level varying means. An amplifier whose amplification factor is constant and a variable attenuator for varying the level of a signal input to the amplifier can be used as the level varying means to vary the amplification factor of the variable amplifier by changing the attenuation factor of the variable attenuator. In the above embodiment, the variable power source is used as a source from which a reference voltage is generated, and the reference voltage is varied by controlling the variable source. If the comparator circuit 3 has the conventional configuration as shown in FIG. 4, the resistor R3 can be used as a variable low resistor to control the variable power source.

In the above embodiment, the APC apparatus is applied to a radio communication system wherein the QAM is used as a modulation system. The APC apparatus can be applied to a radio communication system wherein the linear modulation is used. Various changes and modifications can be made without departing from the spirit or scope of the present invention.

Figure 3:
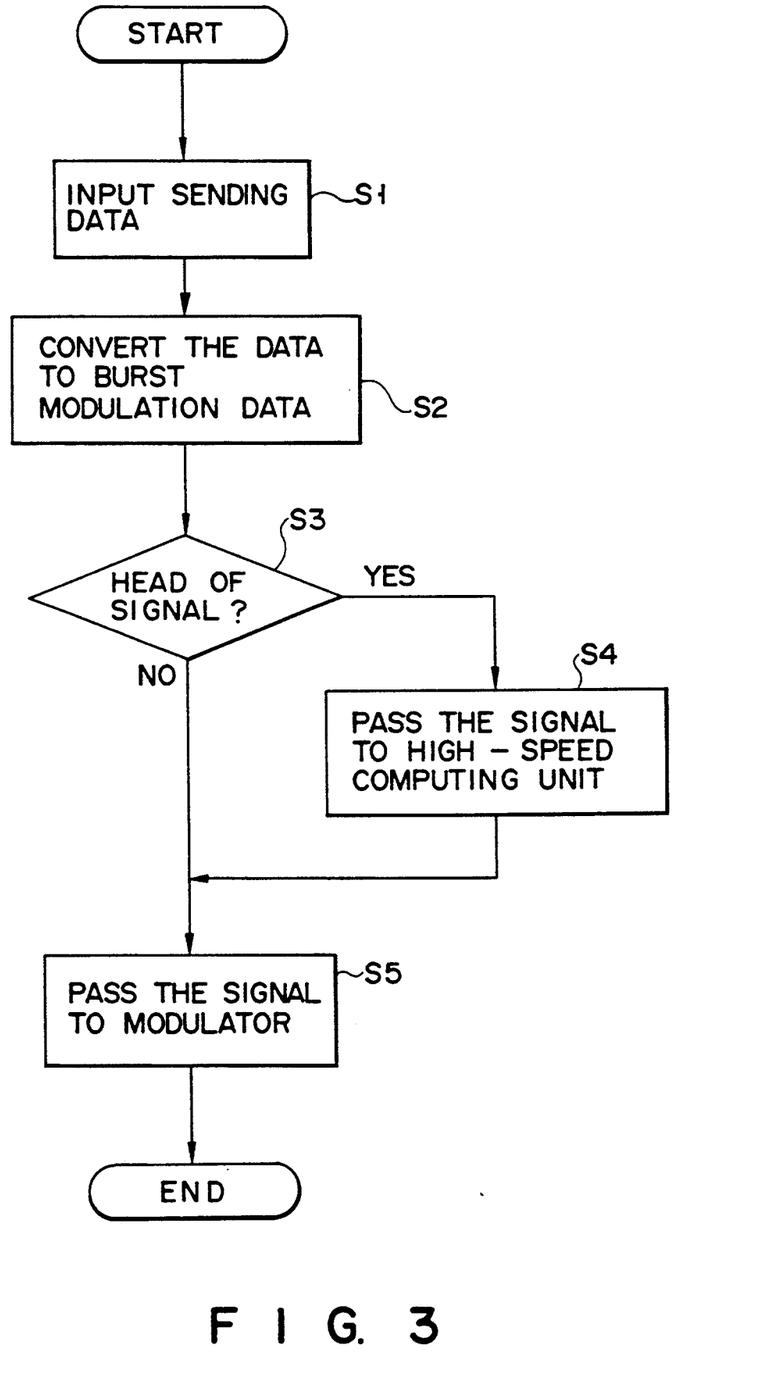
FIG. 3 is a flow chart showing a control routine program activated by a CPU 12 of the apparatus shown in FIG. 1.

FIG. 3 shows a flow chart of a control routine program which is activated by the CPU 12 shown in FIG. 1. The control routine program is executed by the following steps:

(1) Step S1 of inputting sending data to a memory (i.e., RAM);

(2) Step S2 of converting the input sending data into a burst modulation signal;

(3) Step S3 of determining whether or not the burst modulation signal is the initial signal of a time slot;

(4) Step S4 of transmitting the burst modulation signal to a high-speed computing unit when it is determined that the signal is the initial signal of the time slot;

(5) Step S5 of transmitting the burst modulation signal to a modulator when it is determined that the signal is not the initial signal of the time slot.

The automatic power control apparatus according to the present invention comprises: a level varying unit such as a variable amplifier for amplifying a modulated wave output from a transmitter at an amplification factor specified by an external device; a level detecting unit such as a level detector circuit for detecting a power level of the modulated wave output from the level varying unit; a computing unit such as a high-speed computing unit for, during a period other than a time slot assigned to the transmitter, computing an average power level of a modulated wave, which is obtained by linearly modulating digital data to be transmitted in the next time slot, based on the digital data; and a comparing unit such as a comparator circuit for comparing a power level, which is obtained by adding a difference between the average power level computed by the computing unit and a power level of the non-modulated wave to the average power level, with the power level detected by the level detecting unit.

Further, the automatic power control apparatus according to the present invention is so constructed that an amplification factor of the level varying unit is adjusted so that the power levels compared by the comparing unit become equal to each other during a transmission period of the non-modulated wave, and the level varying unit is then operated at the amplification factor during a transmission period of the modulated wave. Even if the automatic power control apparatus is applied to a radio communication system wherein linear modulation such as QAM is used as a modulation system and TDMA is used as a multiplying access system, the average power levels of the time slots can be controlled so as to have the same value.

Figure 6:
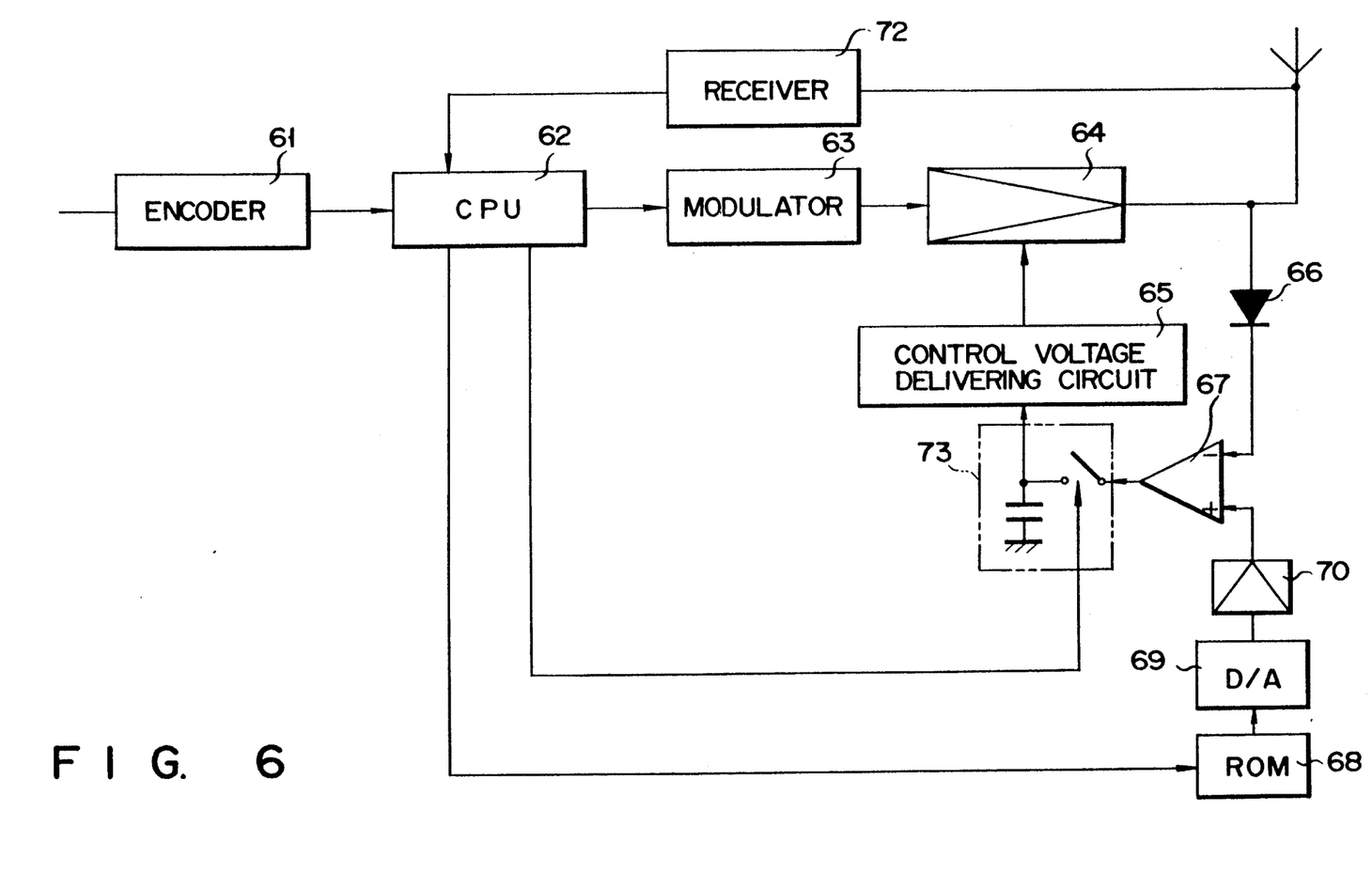
FIG. 6 is a block diagram showing an arrangement of an automatic power control apparatus according to a second embodiment of the present invention.

FIG. 6 is a block diagram showing an arrangement of an automatic power control apparatus according to a second embodiment of the present invention.

A transmit signal (baseband signal) is encoded by an encoder 61 and then input to a CPU 62. The CPU 62 stores the transmit signal in a memory region thereof, converts it into burst modulating data suitable for the TDMA, and inputs the burst modulating data to a modulator 63 at predetermined timing. The modulator 63 subjects a carrier wave to the quadrative amplitude modulation (QAM) using the input data and then supplies a carrier wave signal (modulated signal) to a power amplifier 64.

The power amplifier 64 amplifies the input data in accordance with a control voltage applied from a control voltage delivering circuit 65. A signal output from the power amplifier 64 is detected by a detector circuit 66. A detection signal output from the detector circuit 66 is thus input to a comparator circuit 67.

A ROM 68 stores level control data for correcting a level control signal, which is transmitted from a base station, in accordance with sending data. The level control data is converted from a digital signal to an analog signal by a D/A converter circuit 69 and then input to the computer circuit 67 through an operational amplifier.

The comparator circuit 67 compares the detection signal with the level control data and outputs a signal representing a result of the comparison to a sample/hold circuit 71. The sample/hold circuit 71 holds a signal output from the comparator circuit 67 under the control of CPU 62 and inputs the signal tot he control voltage delivering circuit 65. The control voltage delivering circuit 65 converts an output of the sample/hold circuit 71 into a voltage signal and supplies it to the power amplifier 64.

Figure 7:
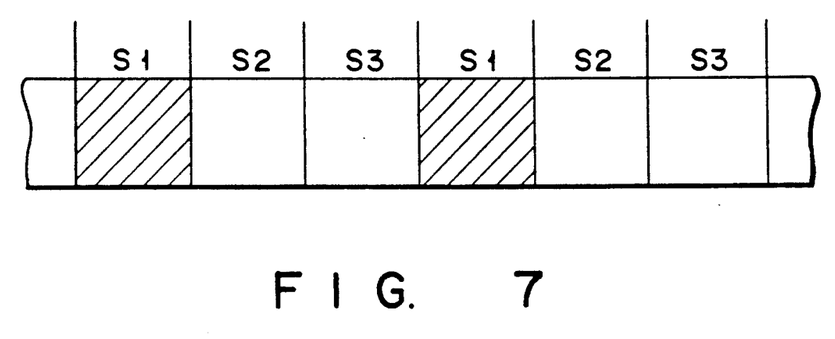
FIG. 7 is a time chart showing a location of time slot S1.

A transmission operation in the TDMA system will be described in order to explain the level control data stored in the ROM 68. A communication channel having a predetermined frequency is divided into, for example, three time slots, and signal is transmitted from a moving communication device to a base station device during one of the time slots. A guard time period 801 for preventing collision of signals transmitted from different moving communication devices and a ramp time period 802 for starting the transmission of the signals ar formed at the leading portion of each of the time slots. The ramp time period 802 corresponds to time required for transmitting, for example, a 6-bit signal (i.e., three symbols). It is desirable that a reference transmission output level (i.e., reference level of transmission output signal which does not rely upon the value of the sending data) for the time slot be determined at the end of the ramp time period thereof.

Figure 8:
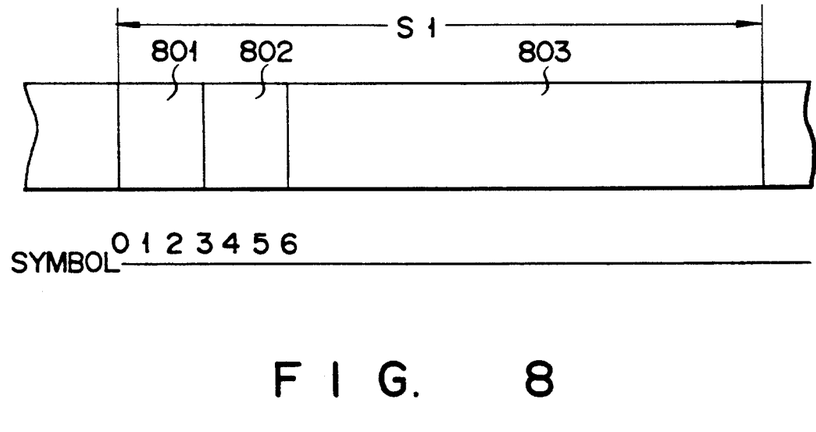
FIG. 8 is a view showing ramp time periods in a plurality of consecutive symbols.
Figure 9:
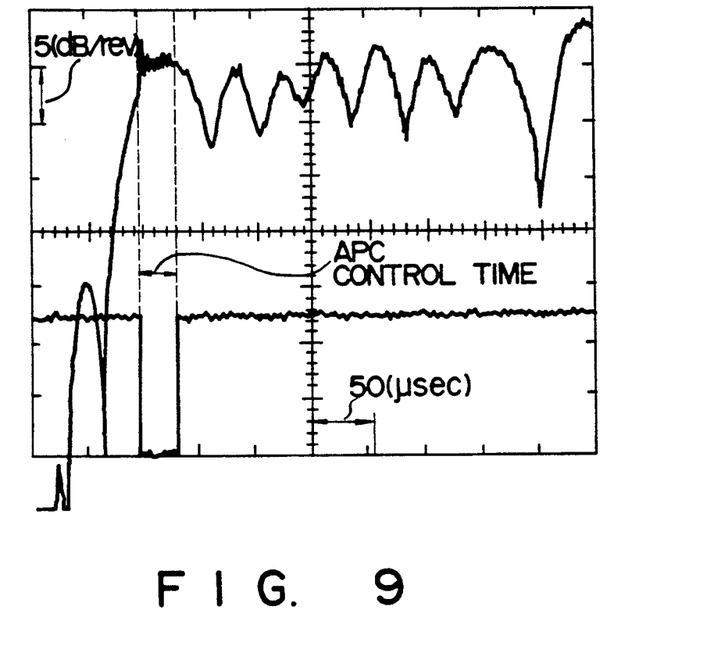
FIG. 9 is a view showing a waveform of signal output from modulator 63 after ramp time period 802.

In the second embodiment of the present invention, automatic power control is performed between symbols 5 and 6 shown in FIG. 8. In FIG. 6, when the burst modulating data is sent to the modulator 63, the CPU 62 activates the sample/hold circuit 71 only while data from the symbols 5 to 6 is being transmitted, and the control voltage is applied to the power amplifier 64 on the basis of the detection signal and level control data. FIG. 9 shows a waveform of signal output from the modulator 63 after the ramp time period 802. The output signal rises during the ramp time period and then varies with the sending data.

Figure 10:
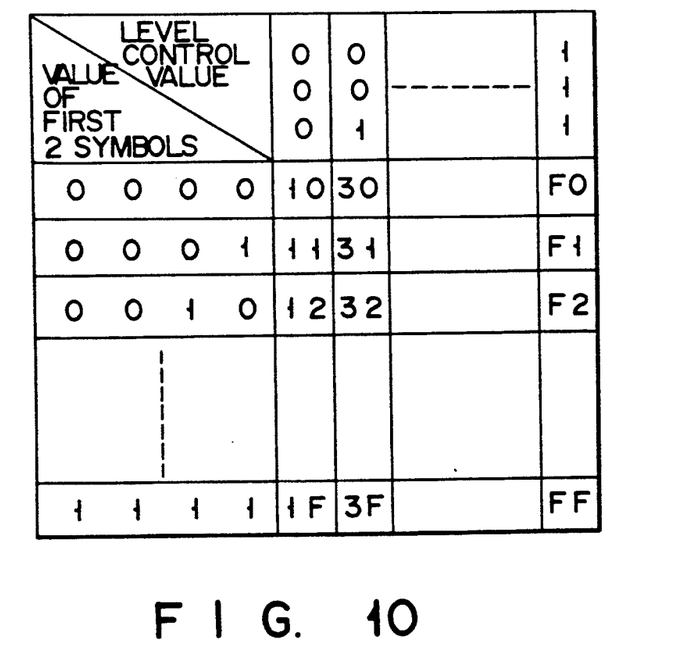
FIG. 10 is a level control rank table stored in a ROM.

Since the rise of the output signal during the ramp time period greatly depends upon values of the first two symbols in the time slot of the sending data, automatic power control between the symbols 5 and 6 is performed in view of the values of the first two symbols. For this reason, a level control data is stored in the ROM 68, as shown in FIG. 10. In FIG. 10, the addresses in the lateral direction correspond to level control information (e.g., eight levels of 000 to 111 if expressed in binary notation). The eight levels of the level control information are values of signals transmitted from the base station and extracted among signals received by a receiver 72 of the moving communication device. The addresses in the longitudinal direction correspond to sending data (constituted of four bits of 0000 to 1111) of the first two symbols of the time slot. The level control data is stored in regions where the addresses in the lateral direction cross those in the longitudinal direction. The level control data is acquired beforehand on the basis of simulation.

Figure 11:
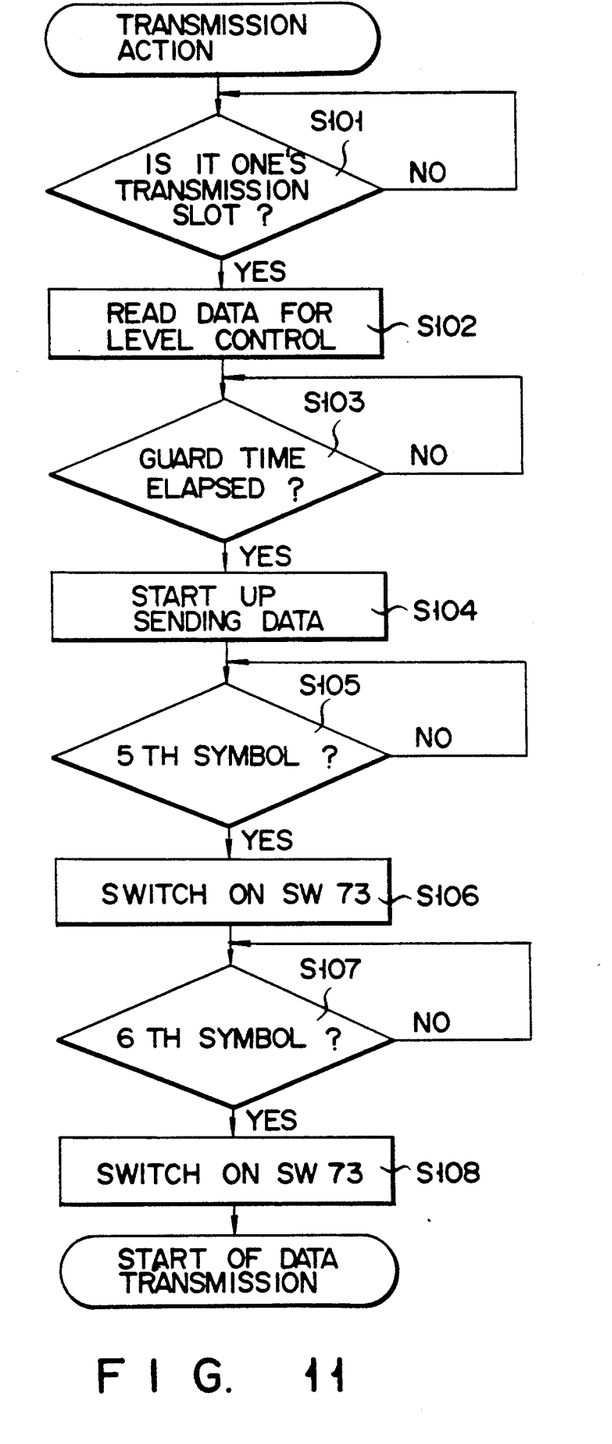
FIG. 11 is a flowchart showing a transmission operation of the automatic power control apparatus according to the second embodiment of the present invention.

FIG. 11 is a flowchart showing a transmission operation of the automatic power control apparatus according to the second embodiment. First it is determined whether it is a transmission slot assigned to the apparatus (step 101). When the transmission slot is available for the apparatus, the CPU 62 reads out level control data from the ROM 68 based on the values extracted by the receiver 72 and the values of the first two symbols (four bits) to be transmitted in the transmission slot (step 102). Since the CPU 62 is so constructed that sending data for at least one slot is stored and then the data are sequentially input to the modulator 63, the values of the first two symbols in the slot can be known before the symbols are transmitted.

The level control data read out from the ROM 68 is input to the D/A converter circuit 69 and converted into an analog signal. The analog signal is then supplied to the comparator circuit 67 through the operational amplifier 70.

Next it is determined whether guard time has elapsed or not (step 103). If the guard time has elapsed, data sending is started up (step 104).

The CPU 62 closes a switch 73 of the sample/hold circuit 67 when the fifth symbol in the slot is transmitted (step 105). Therefore, the feedback of the power amplifier 64 is related to its amplification factor, and the amplification factor is set on the basis of level control information corrected by the sending data of the first two symbols which greatly affects the waveform of a signal rising in a time slot.

The CPU 62 opens the switch 73 (step 108) when the sixth symbol is transmitted (step 107). The amplification factor of the power amplifier 64 is thus kept constant during the rest period of the time slot. After that, the sending data is amplified at the constant amplification factor and transmitted during the time slot.

In the next time slot, new automatic power control is performed in a ramp time period of the slot, so that an amplification factor of the power amplifier 64 is set in the slot.

Similarly, an amplification factor of the power amplifier 64 is set for each time slot.

Figure 12:
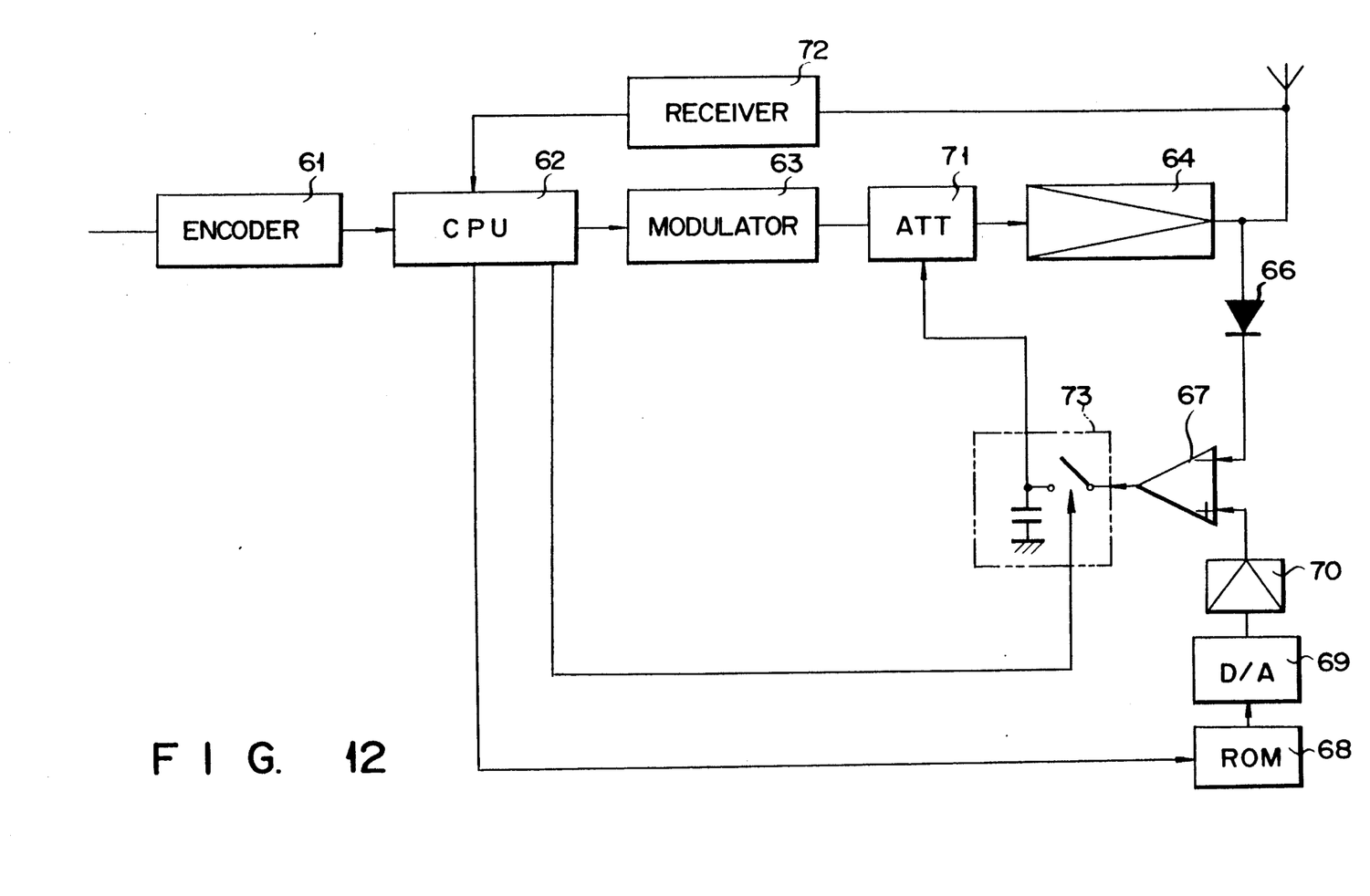
FIG. 12 is a block diagram showing an arrangement of an automatic power control apparatus according to a third embodiment of the present invention.

FIG. 12 is a block diagram showing an arrangement of an automatic power control apparatus according to a third embodiment of the present invention. In FIG. 12, the same structural elements as those in FIG. 6 are denoted by the same reference numerals. In the apparatus shown in FIG. 12, a variable attenuator 71 is arranged before the power amplifier 64, and an output signal of the sample/hold circuit 67 varies an attenuation factor of the variable attenuator 71. Therefore, a signal input to the power amplifier 64 changes with an output and level control data of the detector circuit 66.

According to the present invention, since a reference power of transmission output signal is set every time slot before sending data is transmitted in the time slot, the reference power is not varied with the value of the sending data. Furthermore, since the reference power is set in view of an influence of the value of the sending data upon a rise of the transmission output signal in the time slot, even though the rise of the transmission output signal is varied with the sending data, a variation in the rise is compensated and thus the reference power is not varied every time slot.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. An automatic power control apparatus for controlling digital data output from a transmitter so as to have a predetermined power level while the digital data is linearly modulated and non-modulated wave is added to an initial part of each time slot of a time division multiplexing access system, said automatic power control apparatus comprising:

level varying means for amplifying a modulated wave output from said transmitter at an amplification factor specified by level control means;

level detecting means for detecting a power level of the modulated wave output from the level varying means;

computing means for, during a period other than a time slot assigned to said transmitter, computing a power level of said non-modulated wave which is varied by a modulated wave, said modulated wave obtained by linearly modulating digital data to be transmitted in a next time slot, said computing means also for computing an average voltage of the power level of said time slot;

comparing means for comparing a power level, which is obtained by adding a difference between the power level of the non-modulated wave computed by said computing means and said average voltage of the power level of said time slot to said average voltage, with the power level detected by said level detecting means; and said level control means for operating said level varying mean at an amplification factor of said level varying means during a transmission period of said non-modulated wave, said amplification factor being adjusted during a transmission period of said modulated wave so that said power levels compared by said comparing means become equal to each other.

2. The apparatus according to claim 1, wherein said apparatus further comprises a variable power source which is set to a desired reference voltage by said level varying means, and wherein said level varying means is a variable amplifier, said level detecting means is a level detector, said computing means is a high-speed computing circuit for comparing the average voltage of the power level of said time slot and the power level of said non-modulated wave and setting a voltage which corresponds to a power level which is obtained by adding a difference between the average voltage of the power level of said time slot to a desired power level.

3. The apparatus according to claim 2, wherein an automatic power control operation is performed based on the reference voltage set by circuitry including said variable amplifier, said level detector circuit, a comparator circuit, and a control voltage delivering circuit during an initial period of a time slot assigned to a sending station during which the non-modulated wave is output, and non-modulated waves output from said variable amplifier are controlled so as to have power levels in time slots.

4. The apparatus according to claim 3, further comprising a sample/hold unit for sampling an output voltage of said comparator circuit at a predetermined time of said period when the automatic power control is performed an the power level of the non-modulated wave is optimized, holding the output voltage during the time slot, and supplying the output voltage to said control voltage delivering circuit.

5. The apparatus according to claim 1, wherein said apparatus is connected to a central processing unit which is coupled to an output port, an input port, a modulator, and encoder means for digitally encoding transmit data, said central processing unit capable of receiving data obtained by digitally encoding transmit data by said encoder means through said input port.

6. The apparatus according to claim 5, wherein said apparatus is controlled by a control routine program activated by said central processing unit, and said control routine program includes:

a first step of inputting sending data to a memory;

a second step of converting the input sending data into a burst modulation signal;

a third step of determining whether or not the burst modulation signal is an initial signal of a time slot;

a fourth step of transmitting the burst modulation signal to said high speed computing unit when it is determined that the burst modulation signal is the initial signal of the time slot; and a fifth step of transmitting the burst modulation signal to said modulator when it is determined the burst modulation signal is not the initial signal of the time slot.

* * * * *